US010707877B1

(12) United States Patent
Majumder et al.

(10) Patent No.: US 10,707,877 B1
(45) Date of Patent: Jul. 7, 2020

(54) METHOD AND APPARATUS FOR SWITCHED ADAPTIVE CLOCKING

(71) Applicant: Intel Corporation, Santa Clara, CA (US)

(72) Inventors: Turbo Majumder, Portland, OR (US); Minki Cho, Portland, OR (US); Carlos Tokunaga, Hillsboro, OR (US); Praveen Mosalikanti, Portland, OR (US); Nasser A. Kurd, Portland, OR (US); Muhammad M. Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/455,162

(22) Filed: Jun. 27, 2019

(51) Int. Cl.
*G06F 1/08* (2006.01)
*H03L 5/00* (2006.01)
*H03L 7/099* (2006.01)

(52) U.S. Cl.
CPC .............. *H03L 5/00* (2013.01); *H03L 7/0991* (2013.01)

(58) Field of Classification Search
USPC .................................. 327/147–149, 156–158
See application file for complete search history.

(56) References Cited

U.S. PATENT DOCUMENTS

| 6,483,888 | B1* | 11/2002 | Boerstler | G06F 1/08 327/115 |
| 6,501,304 | B1* | 12/2002 | Boerstler | G06F 1/08 327/34 |
| 6,515,530 | B1* | 2/2003 | Boerstler | G06F 1/08 327/291 |
| 7,539,277 | B2* | 5/2009 | Cao | H03K 23/68 375/376 |
| 8,604,852 | B1* | 12/2013 | Turullols | H03L 7/07 327/159 |
| 9,369,040 | B1* | 6/2016 | Dosluoglu | H02M 3/158 |
| 2009/0258612 | A1* | 10/2009 | Zhuang | H03C 5/00 455/110 |
| 2012/0163632 | A1* | 6/2012 | Lesso | H02M 3/07 381/107 |
| 2014/0269848 | A1* | 9/2014 | Schrom | H03L 7/189 375/148 |
| 2015/0002197 | A1* | 1/2015 | Chatterjee | H03L 7/095 327/159 |
| 2015/0214963 | A1* | 7/2015 | Liu | H03L 7/104 327/156 |

(Continued)

OTHER PUBLICATIONS

Gonzalez, et al, "The 24-Core POWER9 Processor With Adaptive Clocking, 25-Gb/s Accelerator Links, and 16-Gb/s PCIe Gen4", IEEE Journal of Solid-State Circuits, vol. 53, No. 1, Jan. 2018.

(Continued)

*Primary Examiner* — Adam D Houston
(74) *Attorney, Agent, or Firm* — Compass IP Law, PC

(57) ABSTRACT

Switched adaptive clocking is provided. A switched adaptive clocking circuit includes a digitally controlled oscillator, a clock generator and a glitch-free multiplexer. The switched adaptive clocking circuit to adaptively switch a source of an output clock from a main clock generated by a clock source to a digitally controlled oscillator clock generated by a digitally controlled oscillator upon detection of a voltage droop, and to quickly switch back to the main clock after recovery from the voltage droop.

20 Claims, 8 Drawing Sheets

(56) References Cited

U.S. PATENT DOCUMENTS

| | | | | |
|---|---|---|---|---|
| 2016/0065224 | A1* | 3/2016 | Galton | H03L 7/093 |
| | | | | 327/157 |
| 2017/0324417 | A1* | 11/2017 | Leibowitz | H03L 7/093 |
| 2018/0083643 | A1* | 3/2018 | Zerbe | H03L 7/099 |
| 2018/0284828 | A1* | 10/2018 | Mosalikanti | G05F 1/625 |
| 2019/0229736 | A1* | 7/2019 | Kosonocky | H03K 5/14 |
| 2019/0265769 | A1* | 8/2019 | Gelman | H03H 7/06 |

OTHER PUBLICATIONS

Kwak, "A Self-Adjustable Clock Generator With Wide Dynamic Range in 28 nm FDSOI", IEEE Journal of Solid-State Circuits, vol. 51, No. 10, Oct. 2016, 12 pages.

Li, et al, "A 20nm 32-Core 64MB L3 Cache SPARC M7 Processor", ISSCC 2015/Session 4/Processors/4.2, Feb. 23, 2015, 3 pages.

Tschanz, et al, "Adaptive Frequency and Biasing Techniques for Tolerance to Dynamic Temperature-Voltage Variation and Aging", ISSCC 2007/Session 16/Power Distribution and Management/16.4, Feb. 13, 2007, 3 pages.

\* cited by examiner

US 10,707,877 B1

METHOD AND APPARATUS FOR SWITCHED ADAPTIVE CLOCKING

FIELD

This disclosure relates to adaptive clocking techniques and in particular to adapting a clock frequency in proportion to a transient drop in voltage.

BACKGROUND

The maximum operating frequency of a circuit is determined by delay of the critical path of the circuit. The maximum operating frequency is impacted by noise (alternating current (AC) and direct current (DC)) generated by the supply voltage.

Large switching loads are characterized by fast current gradients (surge of current) that leads to a transient drop in supply voltage (also referred to as voltage droop). The conventional method for guaranteeing functional accuracy of a circuit under these conditions uses a frequency guard band, which provides a margin between the maximum allowable frequency at a given operating voltage and the operational frequency at the same voltage to prevent failure during dips in supply voltage.

A fixed conservatively chosen operating frequency provides circuit resiliency to a transient drop in supply voltage at the cost of reduced throughput. Alternately a voltage guard band is added to a given operating voltage to enable operating the circuit at the maximum allowable frequency at the expense of power.

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

Various adaptive clocking techniques have been proposed to reduce the frequency guard band to improve performance or to reduce the voltage guard band to reduce power while still being resilient to transient drops in supply voltage. These techniques rely on reducing the clock frequency in response to transient drop in supply voltage. However, they often suffer from large performance impact due to (i) slow entry to adaptive mode, (ii) coarse-grained adaption during the transient drop in supply voltage, and/or (iii) slow recovery to the original clock frequency.

Switched adaptive clocking (SAC) provides for a very fast method of adapting the clock frequency in proportion to the transient drop in supply voltage, while also performing fast recovery to the original clock frequency when the transient drop in supply voltage ends (that is, after the supply voltage recovers and is at the normal supply voltage).

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Figure 1:
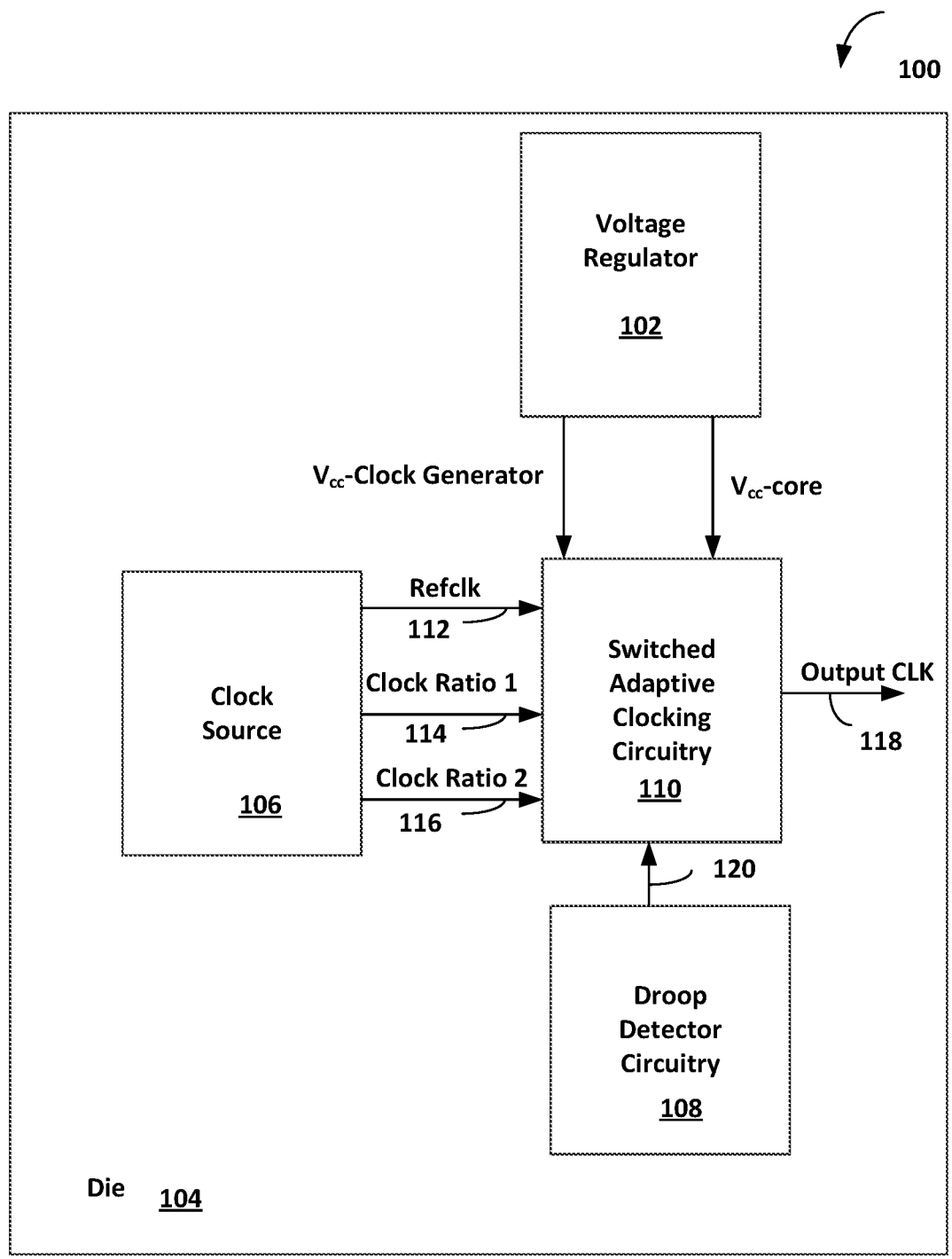
FIG. 1 is a block diagram of a system that includes a power source and a functional block on a die to perform switched adaptive clocking.

FIG. 1 is a block diagram of a system 100 that includes a functional block on a die 104 to perform switched adaptive clocking. A transient drop in voltage (also referred to as voltage droop) can occur in the functional block on a die 104 in response to a large change in load current. The voltage droop can result in a fast and sometimes uneven reduction of supply voltage across the die 104.

A voltage regulator 102 on the die 104 provides a fixed voltage (Vcc-clock generator), that is, a regulated power rail with very little noise that may be referred to as a "clean supply". The voltage regulator 110 also provides a load voltage (Vcc-core) that is more impacted by load-induced noise compared to the fixed voltage (Vcc-clock generator). The load voltage (Vcc-core) runs off a load supply that may be referred to as a "noisy supply".

The load voltage (Vcc-core) is subject to voltage droop dependent on the workload in a core (not shown) in the die 104. Droop detector circuitry 108 detects the voltage droop and indicates that a voltage droop has been detected via a droop detector signal 120.

Clock source circuitry 106 generates a reference clock RefCLK 112 and two clock ratios, clock ratio-1 114 and clock ratio-2 116 that are used by switched adaptive clocking circuitry 110 to provide for a very fast method of adapting the frequency of the output clock (output CLK 118) in proportion to the transient drop in supply voltage.

Figure 2:
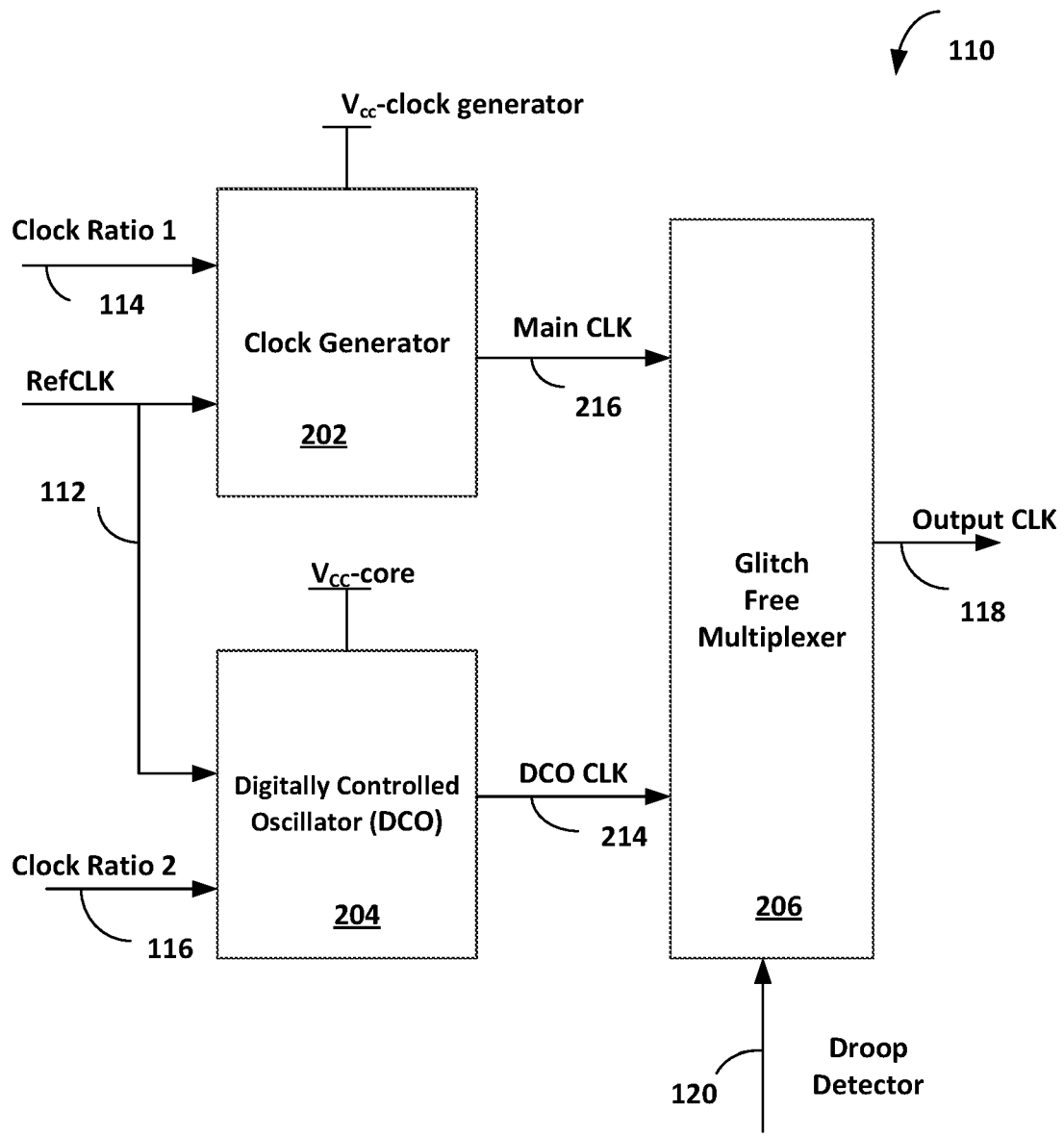
FIG. 2 is an embodiment of the switched adaptive clocking circuitry shown in FIG. 1.

FIG. 2 is an embodiment of the switched adaptive clocking circuitry 110 shown in FIG. 1. The switched adaptive clocking circuitry 110 includes a clock generator 202 digitally controlled oscillator (DCO) 204 and a glitch free multiplexer 206. The clock generator 202 can be implemented as a Frequency Locked Loop (FLL) or a Phase locked loop (PLL) that is locked during normal operation.

Power is supplied to the clock generator by the fixed voltage (Vcc-clock generator) from the voltage regulator 102, that is, a regulated power rail with very little noise that may be referred to as a "clean supply". The clock generator 110 can maintain a stable clock frequency for a main clock (main CLK 216) that has low jitter and is conducive to a desired level of performance.

Power is supplied to the digitally controlled oscillator (DCO) 204 by the load voltage (Vcc-core) that is noisier than the fixed voltage (Vcc-clock generator). The load voltage (Vcc-core) is subject to voltage droop dependent on the workload in a core (not shown). The digitally controlled oscillator 204 can track the delay of the critical path in response to the voltage droop, and thus generate a digitally controlled oscillator clock (DCO CLK 214) that is stretched (that is, the clock period increases (or frequency decreases))) proportional to the supply voltage variations as a result of the voltage droop.

The clock generator 202 may be slow to respond to droop events that necessitate the output CLK 118 to stretch to prevent timing violations. The clock generator 202 can also be slow to recover to the target frequency after the voltage droop has subsided.

The switched adaptive clocking circuitry 110 includes the digitally controlled oscillator 204 and the clock generator 202 to adaptively switch from the main CLK 216 to a DCO CLK 214 in the presence of a voltage droop, and quickly switch back to the main CLK 216 during recovery from the voltage droop.

The switched adaptive clocking circuitry 110 provides quick and seamless switching between an always-locked main CLK 216 provided by the clock generator 202 and a droop-stretchable clock (DCO CLK 214) provided by the digitally controlled oscillator 204. This reduces guard band, improves performance, and reduces recovery latency of the output CLK 118. Furthermore, the switched adaptive clocking circuitry 110 needs minimal calibration.

As shown in FIG. 2, the reference clock RefCLK 112 is input to both the clock generator 202 and the digitally controlled oscillator 204. The frequency of the main CLK 216 and the frequency of the DCO CLK 214 are dependent on a respective clock ratio and the RefCLK 112. One clock ratio signal (clock ratio_1 114) is input to the clock generator 202 and another clock ratio signal (clock ratio_2 116) is input to the digitally controlled oscillator 204 allowing the main CLK 216 (the output clock of the clock generator 202) and the DCO CLK 214 (the frequency of the output clock of the digitally controlled oscillator 204) can be modified. In an embodiment, the digitally controlled oscillator 204 is calibrated ("tuned") via a closed loop frequency locked loop to output a DCO CLK 214 with a frequency that is equal or marginally slower than the frequency of the main CLK 216 output by the clock generator 202.

The frequency of the output CLK 118 is dependent on the clock ratio signal. In an embodiment, clock ratio-2 116 is lower than clock ratio-1 114 to output a DCO CLK 214 with a frequency that is slower than the frequency of the main CLK 216. For example, clock ratio-2 116 can be selected for a DCO CLK 214 with a frequency of 2.8 GHz and clock ratio-1 114 can be selected for a main CLK 216 with a frequency of 3 GHz clock to provide an output CLK 118 with a lower frequency (2.8 GHz) when the DCO CLK 214 is selected at the onset of a droop event. The setting of clock ratio-2 116 lower than clock ratio-1 114 in addition to stretching the DCO CLK 214 in response to the voltage droop mitigates failure on the onset of the voltage droop due to latency in detecting the voltage droop.

A state of the droop detector signal 120 is used to select one of the two clocks, (main CLK 216, DCO CLK 214) that are input to a glitch free multiplexer 206. For example, the droop detector signal 120 can have two logic states, logic '1' or logic '0', logic state '1' can select the main CLK 216 and logic state '0' can select the DCO CLK 214 or vice versa. When a voltage droop is not detected, the state of the droop detector signal 120 selects the locked main CLK 216 at clock ratio-1 to be output from the glitch free multiplexer 206 as the output CLK 118. When the voltage droop is detected, the state of the droop detector signal 120 selects an equal or marginally lower frequency DCO CLK 214 calibrated at clock ratio-2 116 (clock ratio-2≤clock ratio-1) while a voltage droop is detected. The state of droop detector signal 120 selects the main CLK 216 when voltage droop has ended (also referred to as recovered). The DCO CLK 214 is powered by Vcc-core (that can also be referred to as the load supply rail), and thus stretches proportionally during the voltage droop. The DCO CLK 214 is droop-stretchable upon detection of the voltage droop.

Figure 3:
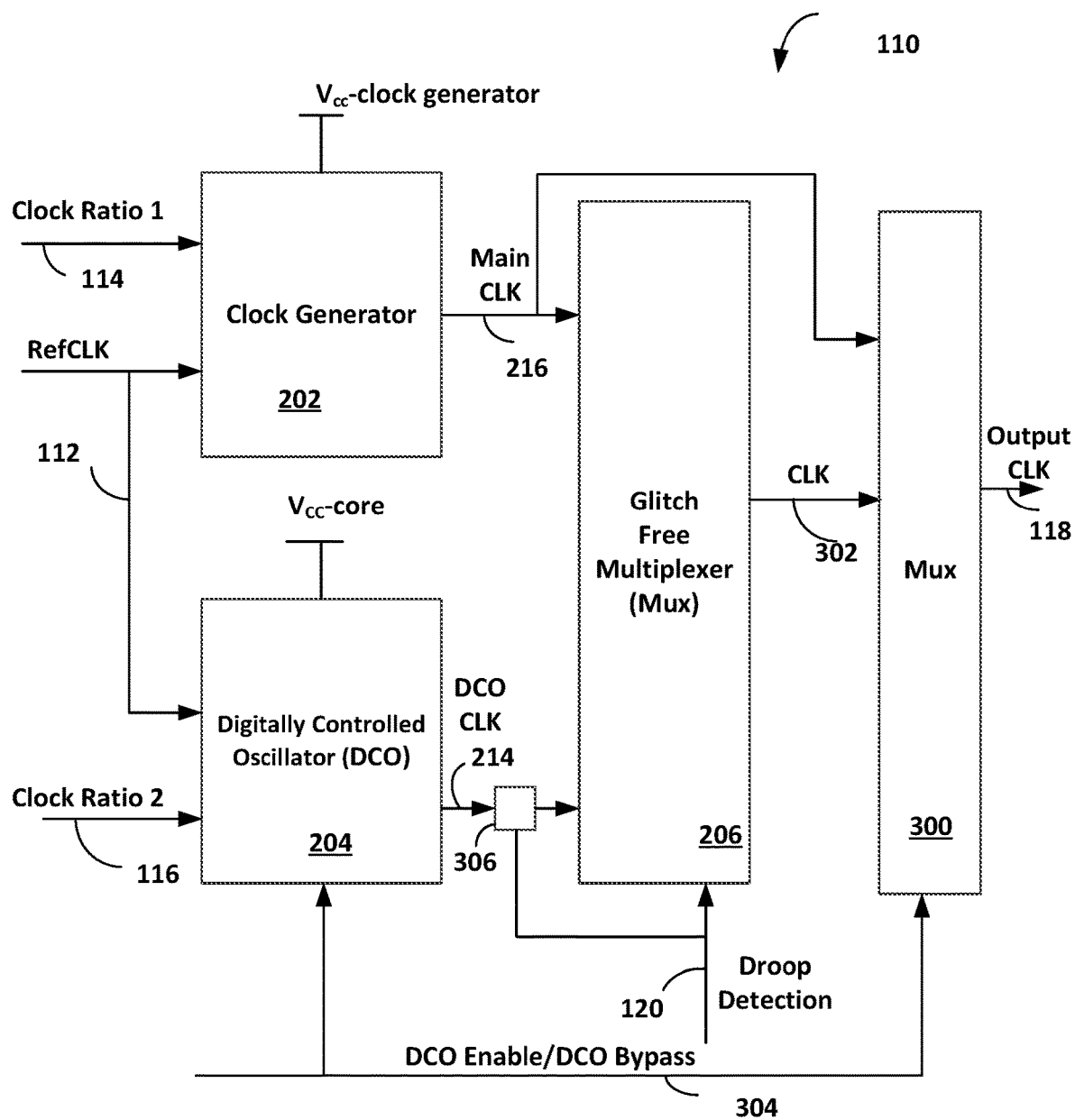
FIG. 3 is another embodiment of the switched adaptive clocking circuitry shown in FIG. 1.

FIG. 3 is another embodiment of the switched adaptive clocking circuitry 110 shown in FIG. 1. FIG. 3 includes the clock generator 202, the digitally controlled oscillator 204 and the glitch free multiplexer 206. To conserve power while the digitally controlled oscillator 204 is not being used to provide output CLK 118, the digitally controlled oscillator 204 is disabled via a DCO Enable/DCO bypass signal 304.

For power sensitive designs, the digitally controlled oscillator 204 can be disabled via the a DCO Enable/DCO bypass signal 304 can be disabled except during the short clock gating period following detection of the voltage droop. If used in a closed loop operation mode to track slow variations, the DCO CLK 214 can be disabled except when a droop is detected or to periodically adjust its delay to track slow variations. In the embodiment shown in FIG. 3, a second multiplexer 300 selects either the main CLK 216 or clock 302 output from the glitch free multiplexer 206 as the output CLK 118 for the switched adaptive clocking circuitry 110 dependent on the state of DCO Enable/DCO bypass signal 304. The DCO CLK 214 is output from the glitch free multiplexer 206 and selected as the output CLK 118 via the glitch free multiplexer 206 and the second multiplexer 300 only during a voltage droop.

The glitch free multiplexer 206 can seamlessly switch the source of the clock 302 between the main CLK 216 and the open loop DCO CLK 214 based on a voltage droop detection (switch source from main CLK 216 to DCO CLK 214 when the droop detector signal 120 is asserted) or recovery detection signal (switch source from DCO CLK 214 to main CLK 216 when the droop detector signal 120 is de-asserted).

To further conserve power while the digitally controlled oscillator 204 is not being used to provide output CLK 118, the digitally controlled oscillator 204 is clock-gated via a logic gate 306 that in an embodiment can be implemented as a two-input AND gate. The inputs to the logic gate 306 are an enable signal and the droop detector signal 120.

With the switched adaptive clocking described in conjunction with FIG. 2, optimal performance is achieved during a voltage droop because the DCO CLK 214 stretches just enough based on the magnitude of the voltage droop, which can be much smaller than the worst case voltage droop. With the glitch free multiplexer 206, the switch of the source clock back to the main CLK 216 is fast without compromising the stability of the main CLK 216, thereby providing a faster recovery from voltage droop.

Figure 4:
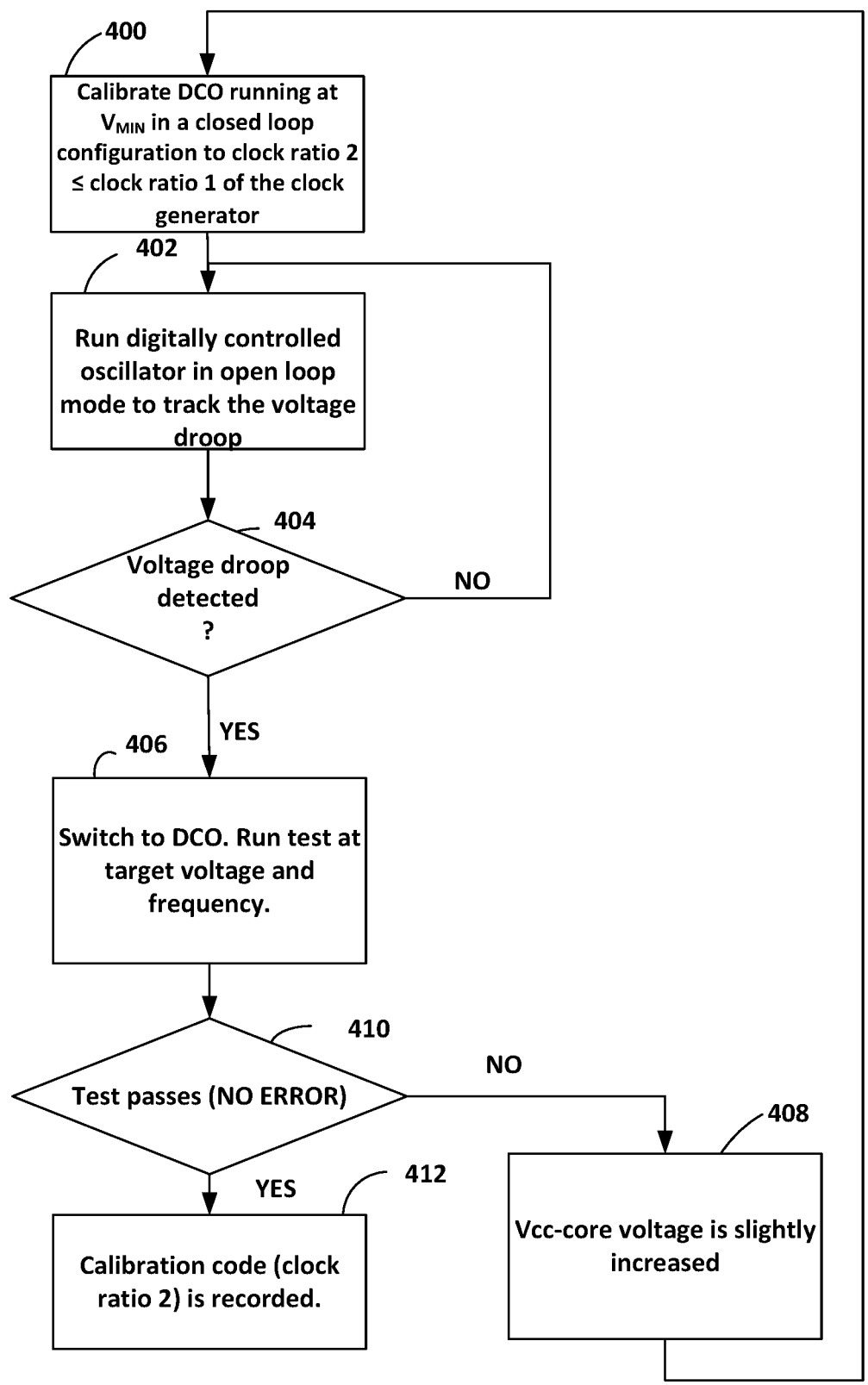
FIG. 4 is a flowgraph illustrating initialization of the switched adaptive clocking circuitry shown in FIG. 2.

FIG. 4 is a flowgraph illustrating initialization of the switched adaptive clocking circuitry 110 shown in FIG. 2. A digitally controlled oscillator is an electronic oscillator whose oscillation frequency is digitally controlled by a programmable counter. Each time the target frequency of the output CLK 118 is changed, the digitally controlled oscillator 204 is calibrated to select a value for the programmable counter so that the digitally controlled oscillator 204 is operating at the required frequency for the selected clock frequency.

At block 400, the digitally controlled oscillator 204 is calibrated at $V_{MIN}$ in a closed loop configuration to clock ratio-2 116≤clock ratio-1 114 of the clock generator 202.

At block 402, the digitally controlled oscillator 204 is run in open loop mode to track the voltage droop. The digitally controlled oscillator is run at the target frequency and Vcc-core.

At block 404, if voltage droop is detected, processing continues with block 406. If not, processing continues with block 404.

At block 406, the droop detector signal 120 is asserted and the glitch free multiplexer 206 switches the source of the output CLK 118 to the DCO CLK 214. A test is run at target frequency and voltage.

At block 410, if the test passes, processing continues with block 412. If not, processing continues with block 408.

At block 408, the Vcc-core voltage is slightly increased by a predefined small step and processing continues with block 410.

At block 412, the Calibration code (clock ratio 2) is recorded.

Figure 5:
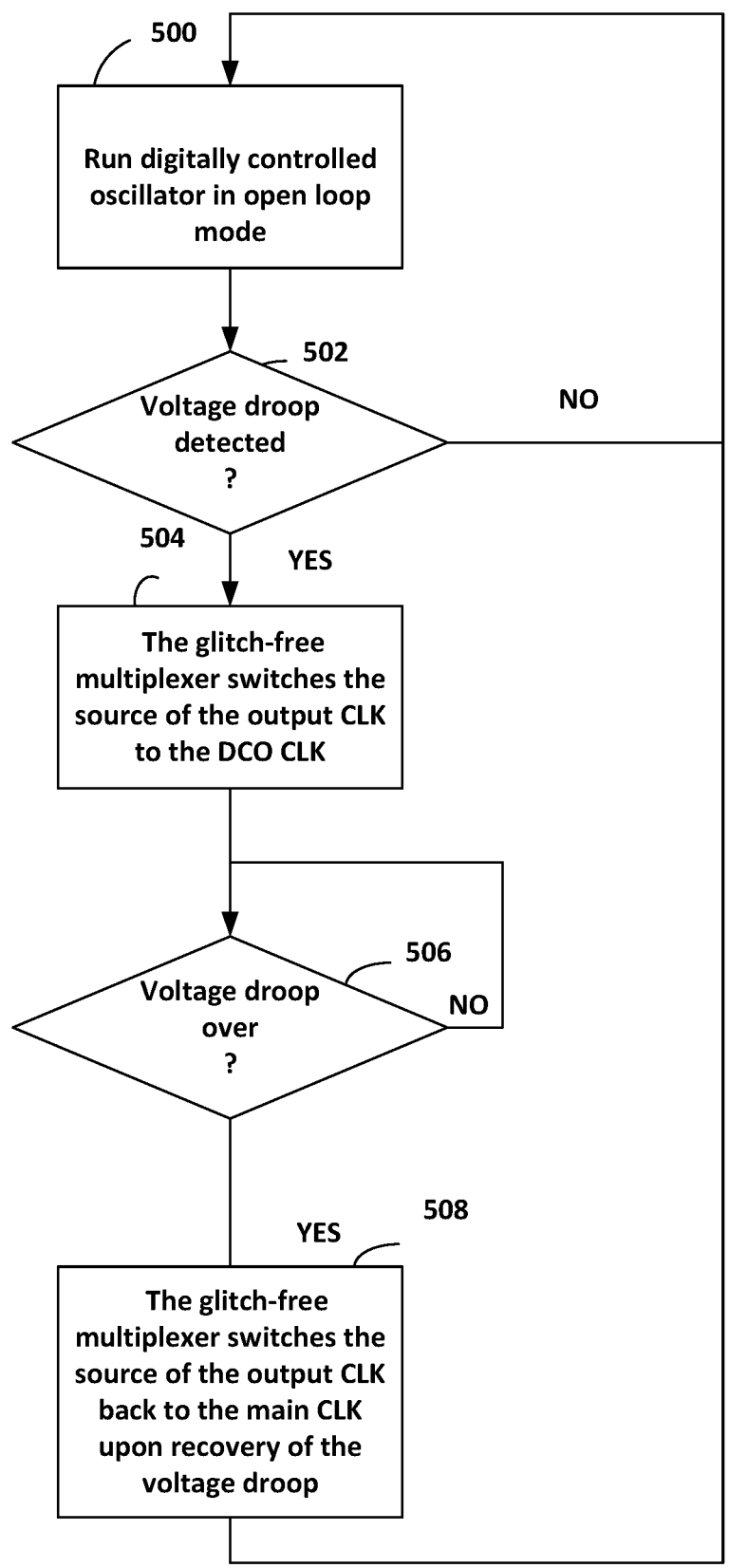
FIG. 5 is a flowgraph illustrating a method of operation of the switched adaptive clocking circuitry shown in FIG. 2 after initialization of the switched adaptive clocking circuit.

FIG. 5 is a flowgraph illustrating a method of operation of the switched adaptive clocking circuitry shown in FIG. 2 after initialization of the switched adaptive clocking circuit.

Figure 6:
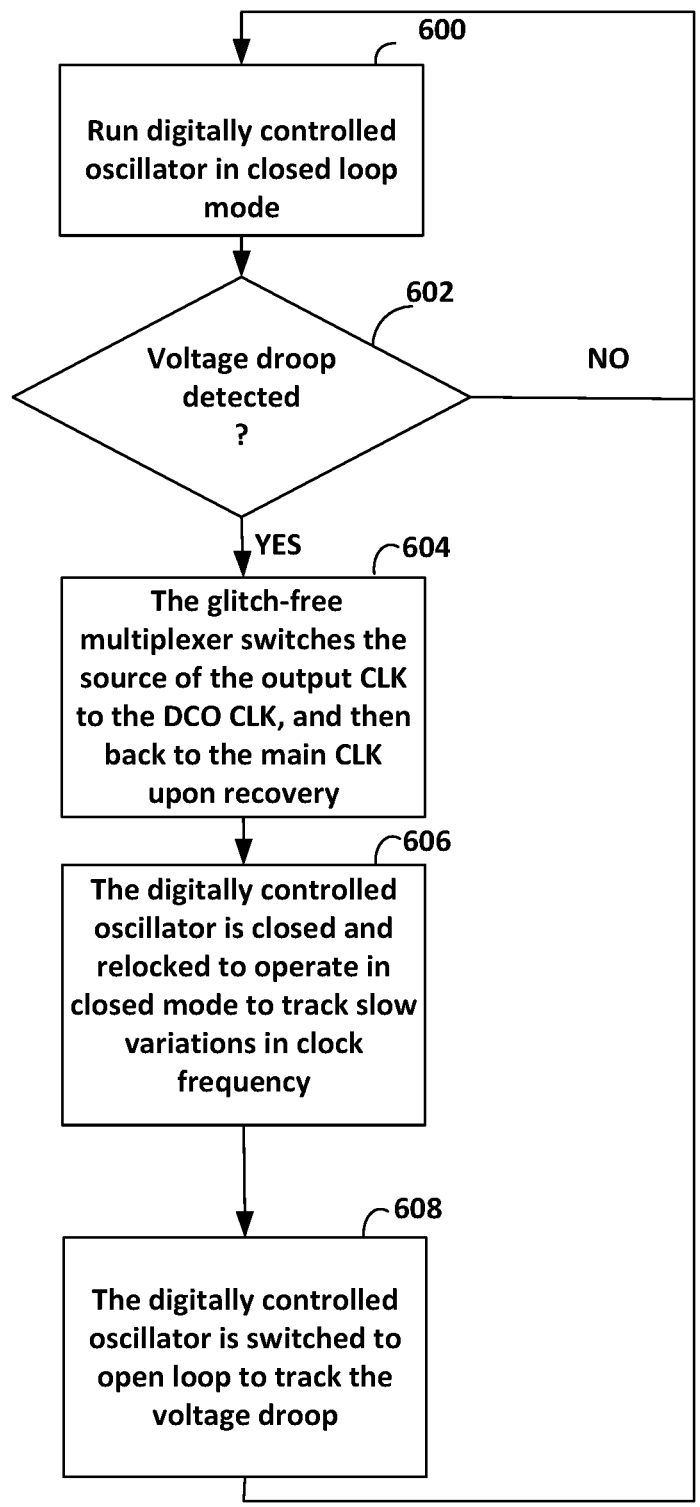
FIG. 6 is a flowgraph illustrating another method of operation of the switched adaptive clocking circuitry shown in FIG. 2 after initialization of the switched adaptive clocking circuit.

At block 500, the digitally controlled oscillator is run in open loop mode using the calibration code selected during the initialization process described in conjunction with FIG. 6.

At block 502, if a voltage droop is detected, processing continues with block 504. If not, processing continues with block 500.

At block 504, voltage droop is detected, the droop detector signal is asserted and the glitch-free multiplexer switches the source of the output CLK 118 to the DCO CLK.

At block 506, if the voltage droop is over, processing continues with block 508. If not, processing continues with block 508 until the voltage droop is over.

At block 508, the droop detector signal is de-asserted and the glitch-free multiplexer switches the source of the output CLK 118 to the main CLK.

FIG. 6 is a flowgraph illustrating another method of operation of the switched adaptive clocking circuitry shown in FIG. 2 after initialization of the switched adaptive clocking circuit.

At block 600, the digitally controlled oscillator 204 is operated in closed loop mode using the calibration code selected during the initialization process described in conjunction with FIG. 6. The calibration code can be the code that is associated with beginning-of-life temperature at initialization and an idle load with no voltage drop At block 602, if a voltage droop is detected, processing continues with block 604. If not, processing continues with block 600.

At block 604, voltage droop is detected, the droop detector signal is asserted and the glitch-free multiplexer switches the source of the output CLK 118 to the DCO CLK 214, and then back to the main CLK 216 upon recovery.

At block 606, the digitally controlled oscillator 204 is closed and relocked to operate in closed mode to track slow variations in clock frequency.

At block 608, a voltage droop has been detected by the clock generator 202, the digitally controlled oscillator 204 is switched to open loop. The digitally controlled oscillator 204 tracks the drooped voltage and processing continues with block 600.

For optimal performance and power efficiency, a processor can be configured to operate with a series of different clock frequencies and associated voltages dependent on the workload in the computer system. Dynamic voltage frequency scaling is a technique implemented in a computer system to manage the computer system's power consumption by dynamically modifying a processor's clock frequency and associated voltage. A frequency and voltage operating point can be dynamically selected based on workload on the computer system. For example, a workload on a computer system may be an application for a video conference and/or an application to edit a document. Each frequency and voltage operating point can be referred to as a performance state (P-State). For a processor with 0-n power states, P-State 0 (P0) can provide the maximum power and frequency and P-State n (Pn) can provide the lowest power and frequency.

Typically, the output CLK 118 is disabled (for example, via a logic gate) while a processor's clock frequency and associated voltage is being modified until the new voltage and frequency are stable. Disabling the clock results in reducing performance of a computer system.

In an embodiment of a circuit to provide dynamic voltage frequency scaling (DVFS) the calibrated digitally controlled oscillator shown in FIG. 2 can be used as an auxiliary clock source to provide a continuous clock during a voltage-frequency transition for dynamic voltage frequency scaling.

Figure 7:
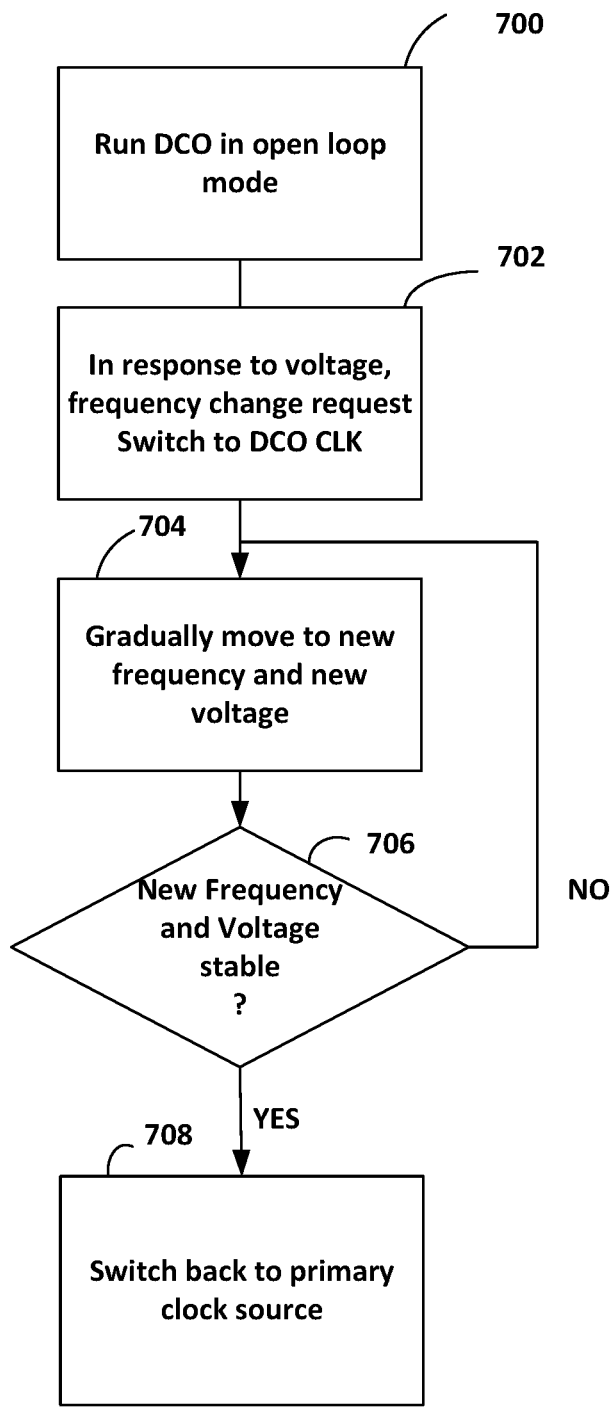
FIG. 7 is a flowgraph of a method to perform dynamic voltage frequency scaling using the digitally controlled oscillator shown in FIG. 2.

FIG. 7 is a flowgraph of a method to perform dynamic voltage frequency scaling using the digitally controlled oscillator shown in FIG. 2 For example, the dynamic voltage frequency scaling may be to change from a first frequency, voltage pair ($F_{TARGET\_1}$,$V_1$) to a second frequency, voltage pair ($F_{TARGET\_2}$,$V_2$).

At block 700, in response to a request to perform dynamic voltage frequency scaling to change from a first frequency, voltage pair ($F_{TARGET\_1}$,$V_1$) to a second frequency, voltage pair ($F_{TARGET\_2}$,$V_2$), the digitally controlled oscillator is operated in open loop mode using a digitally controlled oscillator code selected during initialization of the digitally controlled oscillator as discussed in conjunction with the method shown in FIG. 6.

At block 702, the digitally controlled oscillator is switched to closed mode and the clock source is switched from a primary clock source to the digitally controlled oscillator.

At block 704, the frequency of the primary clock source and the voltage are gradually transitioned (ramped up or down) to a second frequency, voltage pair ($F_{TARGET\_2}$,$V_2$) while the digitally controlled oscillator is supplying the clock.

At block 706, if the primary clock source and the voltage are stable at the second frequency, voltage pair ($F_{TARGET\_2}$,$V_2$), processing continues with block 706. If not, processing continues with block 704 to continue to ramp to the second frequency, voltage pair ($F_{TARGET\_2}$,$V_2$).

At block 708, the clock source is switched from the digitally controlled oscillator back to the primary clock source.

Figure 8:
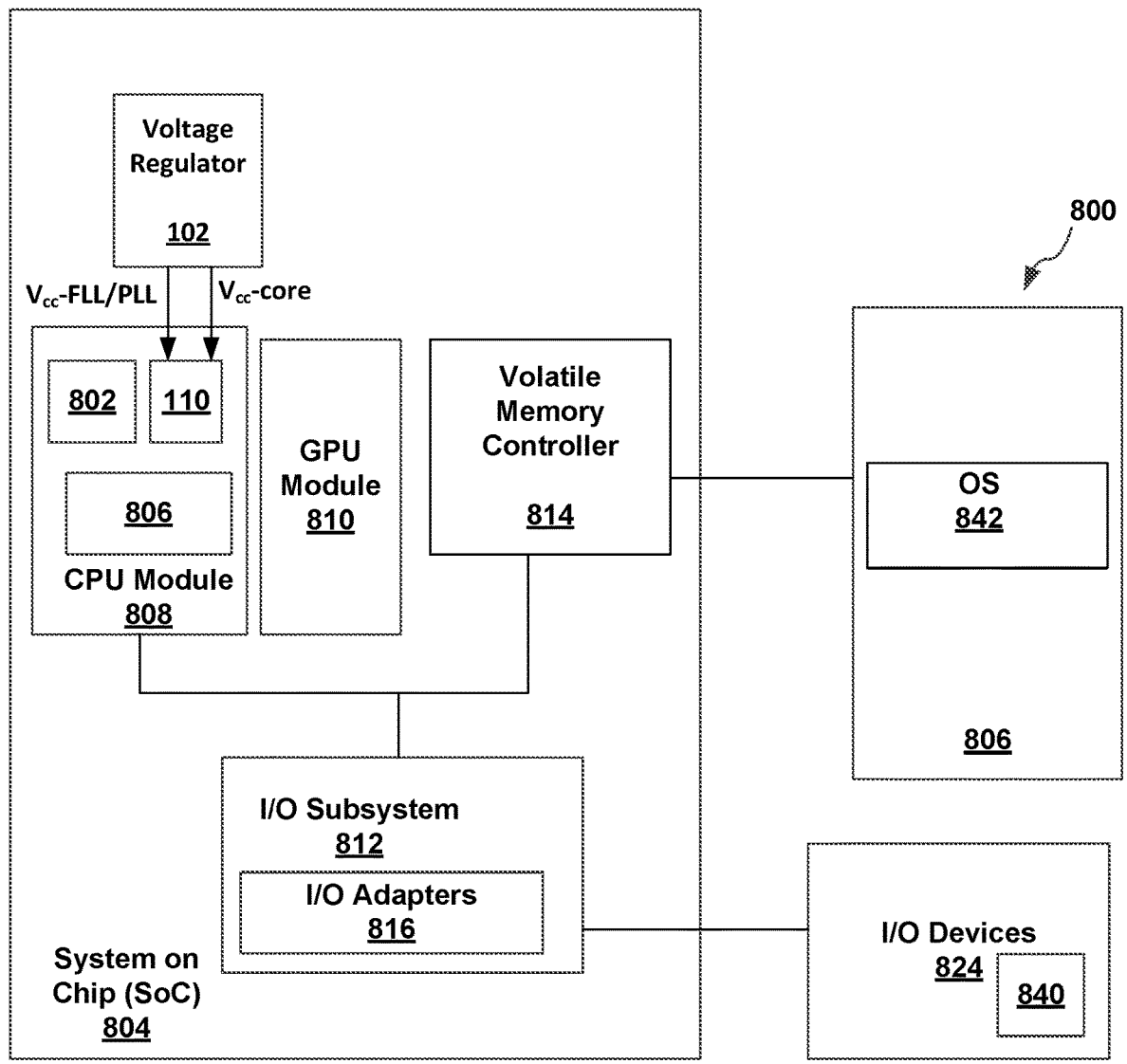
FIG. 8 is a block diagram of an embodiment of a computer system that includes switched adaptive clocking circuitry.

FIG. 8 is a block diagram of an embodiment of a computer system 800 that includes switched adaptive clocking circuitry 110. Computer system 800 can correspond to a computing device including, but not limited to, a server, a workstation computer, a desktop computer, a laptop computer, and/or a tablet computer.

The computer system 800 includes a system on chip (SOC or SoC) 804 which combines processor, graphics, memory, and Input/Output (I/O) control logic into one SoC package. The SoC 804 includes at least one Central Processing Unit (CPU) module 808, a volatile memory controller 814, and a Graphics Processor Unit (GPU) 810. In other embodiments, the volatile memory controller 814 can be external to the SoC 804. Although not shown, each of the processor core(s) 802 can internally include one or more instruction/data caches, execution units, prefetch buffers, instruction queues, branch address calculation units, instruction decoders, floating point units, retirement units, etc. The CPU module 808 can correspond to a single core or a multi-core general purpose processor, such as those provided by Intel® Corporation, according to one embodiment.

The Graphics Processor Unit (GPU) 810 can include one or more GPU cores and a GPU cache which can store graphics related data for the GPU core. The GPU core can internally include one or more execution units and one or more instruction and data caches. Additionally, the Graphics Processor Unit (GPU) 810 can contain other graphics logic units that are not shown in FIG. 8, such as one or more vertex processing units, rasterization units, media processing units, and codecs.

The switched adaptive clocking circuitry 110 may be included in dynamic frequency scaling circuitry in SoC 804. The dynamic frequency scaling circuitry can perform dynamic voltage frequency scaling to transition to a higher target clock frequency and associated target voltage. The dynamic voltage frequency scaling is performed in microsecond timeframe state changes, by dynamically varying a reference clock based on the current ratio while gradually increasing the clock frequency (also referred to as a frequency walk), and switching to a slower reference clock (finer resolution) as appropriate. For example, Dynamic frequency scaling circuitry in processor core 802 can be used to increase the clock frequency to perform a task such as video playback-related image decompression, then decrease the clock frequency in a low-power mode while waiting for the next processor task. The change in clock frequency based on processor tasks can be referred to as "sprint-to-stop". Dynamic frequency scaling circuitry can also be included in a display engine or graphics engine in the Graphics Processor Unit (GPU) 810 and in a display engine or image processing unit in I/O adapters 816.

In one embodiment, the switched adaptive clocking circuitry 110 can provide output CLK 118 to multiple cores 802. In another embodiment, each core 802 can have switched adaptive clocking circuitry 110 to provide a separate output CLK 118 for the core 802.

Within the I/O subsystem 812, one or more I/O adapter(s) 816 are present to translate a host communication protocol utilized within the processor core(s) 802 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 816 can communicate with external I/O devices 824 which can include, for example, user interface device(s) including a display and/or a touch-screen display 840, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also include a byte-addressable write-in-place three dimensional crosspoint memory device, or other byte addressable write-in-place NVM devices (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

Volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein can be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2

(HBM version 2), currently in discussion by JEDEC, or others or combinations of memory technologies, and technologies based on derivatives or extensions of such specifications. The JEDEC standards are available at www.jedec.org.

An operating system 842 is software that manages computer hardware and software including memory allocation and access to I/O devices. Examples of operating systems include Microsoft® Windows®, Linux®, iOS® and Android®.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
a switched adaptive clocking circuit, the switched adaptive clocking circuit comprising:
a digitally controlled oscillator to generate a digitally controlled oscillator clock;
a clock generator to generate a main clock; and
a glitch-free multiplexer to output one of the main clock or the digitally controlled oscillator clock as an output clock based on a state of a droop detection signal.

2. The apparatus of claim 1, wherein the digitally controlled oscillator clock is output as the main clock upon detection of a voltage droop.

3. The apparatus of claim 2, wherein the digitally controlled oscillator clock is droop-stretchable upon detection of the voltage droop.

4. The apparatus of claim 2, wherein the main clock is output as the output clock upon recovery from the voltage droop.

5. The apparatus of claim 1, wherein the clock generator to provide the main clock includes a phase locked loop that is locked during normal operation and during a droop event.

6. The apparatus of claim 1, wherein the switched adaptive clocking circuit is a dynamic voltage frequency scaling (DVFS) circuit.

7. The apparatus of claim 1, wherein a reference clock is input to both the digitally controlled oscillator and the clock generator and a first clock ratio is input to the clock generator and a second clock ratio is input to the digitally controlled oscillator, the second clock ratio is lower than the first clock ratio to provide a digitally controlled oscillator clock that has a lower frequency than the main clock that is output by the clock generator.

8. A method performed in a clocking circuit, comprising:
generating, by a digitally controlled oscillator, a digitally controlled oscillator clock;
generating, a main clock by a clock generator; and
outputting an output clock, by a glitch-free multiplexer, one of the main clock or the digitally controlled oscillator based on a state of a droop detection signal.

9. The method of claim 8, wherein the digitally controlled oscillator clock is output as the main clock upon detection of a voltage droop.

10. The method of claim 9, wherein the digitally controlled oscillator clock is droop-stretchable upon detection of the voltage droop.

11. The method of claim 9, wherein the main clock is output as the output clock upon recovery from the voltage droop.

12. The method of claim 8, wherein the clock generator to provide the main clock includes a phase locked loop that is locked during normal operation and during a droop event.

13. The method of claim 8, wherein the clocking circuit is a dynamic voltage frequency scaling (DVFS) circuit.

14. The method of claim 8, wherein a reference clock is input to both the digitally controlled oscillator and the clock generator and a first clock ratio is input to the clock generator and a second clock ratio is input to the digitally controlled oscillator, the second clock ratio is lower than the first clock ratio to provide a digitally controlled oscillator clock that has a lower frequency than the main clock that is output by the clock generator.

15. A system comprising:
a processor, the processor comprising:
a switched adaptive clocking circuit, the switched adaptive clocking circuit comprising:

a digitally controlled oscillator to provide a digitally controlled oscillator clock;

a clock generator to provide a main clock; and a glitch-free multiplexer to output one of the main clock or the digitally controlled oscillator clock as an output clock based on a state of a droop detection signal; and a display communicatively coupled to the processor.

16. The system of claim 15, wherein the digitally controlled oscillator clock is output as the main clock upon detection of a voltage droop.

17. The system of claim 16, wherein the digitally controlled oscillator clock is droop-stretchable upon detection of the voltage droop.

18. The system of claim 16, wherein the main clock is output as the output clock upon recovery from the voltage droop.

19. The system of claim 15, wherein the clock generator to provide the main clock includes a phase locked loop that is locked during normal operation and during a droop event.

20. The system of claim 15, wherein a reference clock is input to both the digitally controlled oscillator and the clock generator and a first clock ratio is input to the clock generator and a second clock ratio is input to the digitally controlled oscillator, the second clock ratio is lower than the first clock ratio to provide a digitally controlled oscillator clock that has a lower frequency than the main clock that is output by the clock generator.

\* \* \* \* \*